US008283629B1

(12) United States Patent
Tuggle et al.

(10) Patent No.: US 8,283,629 B1
(45) Date of Patent: Oct. 9, 2012

(54) ABERRATION-CORRECTED WIEN EXB MASS FILTER WITH REMOVAL OF NEUTRALS FROM THE BEAM

(75) Inventors: David Tuggle, Portland, OR (US); N. William Parker, Hillsboro, OR (US); Mark W. Utlaut, Scappoose, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/089,991

(22) Filed: Apr. 19, 2011

Related U.S. Application Data

(60) Provisional application No. 61/476,135, filed on Apr. 15, 2011.

(51) Int. Cl.
*H01J 40/00* (2006.01)
*H01J 47/00* (2006.01)
*H01J 3/14* (2006.01)

(52) U.S. Cl. ............. 250/305; 250/396 ML; 250/396 R; 250/310; 250/311

(58) Field of Classification Search ............... 250/492.2, 250/492.21, 310, 311
See application file for complete search history.

(56) References Cited

U.S. PATENT DOCUMENTS

| | | | |
|---|---|---|---|
| 4,697,086 A | | 9/1987 | Ishitani et al. |
| 4,755,685 A | * | 7/1988 | Kawanami et al. ........ 250/492.2 |
| 4,789,787 A | | 12/1988 | Parker |
| 4,929,839 A | | 5/1990 | Parker et al. |
| 7,501,644 B2 | * | 3/2009 | Zani et al. ................. 250/492.21 |
| 7,507,956 B2 | * | 3/2009 | Frosien et al. ................. 250/305 |
| 2002/0104966 A1 | * | 8/2002 | Plies et al. ..................... 250/311 |

FOREIGN PATENT DOCUMENTS

FR   2723664   9/1994

OTHER PUBLICATIONS

Teichert, J., et al., "Achromatic two-stage E X B mass filter for a focused ion beam column with collimated beam", Meas. Sci. and Technol., 1993, pp. 754-763, vol. 4.
Extended European search report dated Jul. 27, 2012 for Appl. No. 12164205.2.

* cited by examiner

*Primary Examiner* — Nikita Wells
*Assistant Examiner* — Johnnie L Smith
(74) *Attorney, Agent, or Firm* — Scheinberg & Associates, PC; Michael O. Scheinberg

(57) ABSTRACT

A mass filter for an ion beam system includes at least two stages and reduces chromatic aberration. One embodiment includes two symmetrical mass filter stages, the combination of which reduces or eliminates chromatic aberration, and entrance and exit fringing field errors. Embodiments can also prevent neutral particles from reaching the sample surface and avoid crossovers in the beam path. In one embodiment, the filter can pass a single species of ion from a source that produces multiple species. In other embodiments, the filter can pass a single ion species with a range of energies and focus the multi-energetic ions at the same point on the substrate surface.

10 Claims, 8 Drawing Sheets

ABERRATION-CORRECTED WIEN EXB MASS FILTER WITH REMOVAL OF NEUTRALS FROM THE BEAM

This application claims priority from U.S. Provisional Application No. 61/476,135, filed Apr. 15, 2011.

TECHNICAL FIELD OF THE INVENTION

The present invention relates to a focused ion beam system and in particular a focused ion beam system having an ion source that produces multiple species of ions.

BACKGROUND OF THE INVENTION

Some focused ion beam (FIB) columns are intended for use with ion sources which emit multiple ion species. In order to select only one of these ion species for the beam to be focused on a substrate, the FIB column will typically include a mass filter. One type of mass filter, a "Wien filter," uses crossed electric and magnetic fields (E×B) to deflect unwanted ion species off-axis, thereby causing them to strike a mass-separation aperture and is also referred to as an "E×B filter." An E×B filter operates according to principles well-known in the art: crossed electric and magnetic fields (both generally perpendicular to the beam direction through the mass filter) induce forces on the ions in the beam in opposite directions transversely to the beam motion. The relative strengths of these two forces are determined by the electric and magnetic field strengths, controlled by voltage and current supplies that energize the electrodes and magnetic poles.

FIG. 1 is a side cross-sectional view of a prior art Wien (E×B) mass filter 102 in a focused ion beam (FIB) column 104 that includes an upper lens 106 and a lower lens 108 that combine to focus an ion beam onto a substrate surface 112. Ions 110 of three different ion species are shown being emitted by a source tip 114 induced by a voltage applied between the source tip 114 and an extractor electrode (not shown). This source structure is typical of that in a liquid metal ion source (LMIS), however other types of ion sources may be used in the prior art. Ions 110 are then focused by the upper lens 106 into a plane 120 of a mass separation aperture 122. The Wien filter 102 includes electrodes 130 that produce an electrostatic field and a source (not shown) of a magnetic field such as a coil or permanent magnet (the magnetic poles would be in front of and behind the plane of FIG. 1). Wien filter 102 deflects low mass ions 136 and high mass ions 138 off-axis, leaving the middle mass ions 140 largely undeflected. These middle mass ions 140 then pass through the aperture 122 and are focused by the lower lens 108 onto substrate surface 112. As shown by the formulas below, low mass ions 136 have higher velocities for the same beam energy than do high mass ions 138. Since the electric force is the same for all ions (having the same charge) while the magnetic force is proportional to velocity, the faster low mass ions 136 will be deflected more by the magnetic field than the slower high mass ions 138—thus the lower mass ions are deflected in the direction of the magnetic force (to the left), while the high mass ions are deflected in the direction of the electric force (to the right). For middle mass ions 140, the electric and magnetic forces are balanced (i.e., having equal magnitudes in opposite directions), giving no net force.

In FIG. 1, an electric field 142 is horizontal in the plane of the figure (pointing from the positive electrode 130 at the left towards the negative electrode 130 at the right (making the electric force on a positive ion towards the right), while the magnetic field 144 is perpendicular to, and pointing out of, the plane of the figure (making the magnetic force on a positive ion towards the left). If the ion source 114 is emitting a number of ion species with different charge-to-mass ratios, it is possible to set the electric field 142 and magnetic field 144 strengths so that one ion species may pass through the E×B mass filter undeflected—in FIG. 1, this species is the middle mass ions 140. The low mass ions 136 and high mass ions 138 are deflected to the left and right, respectively, as shown. Only the middle mass ions 140 pass through the mass separation aperture 122, to then be focused onto the substrate surface 112 by the lower lens 108. At the top and bottom of the E×B mass filter 102, field termination plates 150 cut off both the electric and magnetic fields, thereby reducing fringe-field aberrations.

To better understand the aberrations induced by the E×B filter, FIG. 2 shows the same two-lens column 104 and prior art E×B mass filter 102 as in FIG. 1, but with the mass separation aperture plate 120 (see FIG. 1) removed. Note that ions of the three different species (high, middle and low mass) are focused at three different locations on the substrate due to the deflection of the Wien filter. Ions having the same mass but with differing energies will also be deflected differently by the E×B filter due to chromatic aberration.

With no aperture plate 122, all the ions will pass to substrate surface 112 as shown. The E×B filter deflects the low mass ions 136 to the left and the high mass ions 138 to the right at the plane of the lower lens. The three crossovers (low mass crossover 236, middle mass crossover 240 and high mass crossover 238) formed by the focusing effects of the upper lens 106 combined with the mass separation effects of the E×B mass filter 102 form "virtual sources" that are imaged by the lower lens 108 onto the substrate 112. Because these three virtual sources are spatially separated by the E×B filter, their three respective images at the substrate 112 are also separated as shown—the separation distances at the substrate 112 are demagnified by lens 108 from the corresponding separations of crossovers 236, 240, and 238 at the plane of the (removed) mass separation aperture 120. Similarly, the chromatic aberration of the E×B causes the separation of ions having the same mass but different energies. This can be seen from the (non-relativistic) equation for the ion velocity at the E×B filter:

$$\tfrac{1}{2} m \cdot v^2 = n\, e\, V = \text{the energy of the ion}$$

$$v = sqrt(2\, n\, e\, V/m) = \text{the velocity of the ion}$$

Where
m = the ion mass
v = the ion velocity
n = the ion charge state (1=singly-ionized, 2=doubly-ionized)
e = the elemental charge
V = the accelerating potential in the electron gun
If the two fields in the E×B filter are:
E = electric field
B = magnetic field
Then the net force on an ion passing through the filter with a velocity, v, will be:

$$F_{total} = F_{electric} + F_{magnetic} = n \cdot e \cdot [E - (v/c) \cdot B]$$

Where
$F_{electric} = n \cdot e \cdot E$
$F_{magnetic} = -n \cdot e \cdot (v/c) \cdot B$ (opposite in direction from $F_{electric}$)
Thus, the Wien filter is seen to be actually a velocity filter. Because ions of differing masses (and the same nominal energies) will have differing velocities (lower masses faster, higher masses slower), Wien filters are commonly used (and referred to) as "mass filters." Even for a single ion species, however, there will be a spread in velocities due to the inherent spread in energy (around the nominal energy) of ions emitted by any type of ion source—for example, energy spreads from liquid metal ion sources typically have FWHM energy spreads of around 5 eV. The dispersion effects on the beam due to these energy spreads cause a chromatic aberration which will blur the focused beam at the substrate if not corrected.

Another disadvantage of the ion beam column shown in FIG. 1 is that it includes a beam crossover, that is, a point in the beam path where the ions cross the optical axis. The crossover has three deleterious effects: 1) electrostatic repulsions are increased as the particles are brought closer together at the crossover itself, 2) forming a crossover generally makes the beam diameter smaller throughout the entire column (when compared with the beam diameter without a crossover), also increasing space-charge effects, and 3) sputtering of the mass separation aperture is increased at the impact points of the non-transmitted ion beams since these beams are focused at the plane of the aperture (e.g., at crossovers 236 and 238), thereby increasing the beam current densities and thus the sputter rates perpendicular to the plane of the mass separation aperture (i.e., focused non-selected beams sputter through the aperture faster than unfocused non-selected beams).

The electrostatic repulsion at the crossover spreads the beam, reducing the beam current density at the substrate surface. At the crossover, two separate electrostatic repulsion effects occur:

1) Boersch Effect—this is the increase in beam energy spread due to axial beam scattering. Essentially, one ion gains energy at the expense of another.

2) Loeffler Effect—this is the sideways scattering of the charged particles, causing the final focused spot to be larger and/or more blurry.

"Achromatic two-stage E×B mass filter for a focused ion beam column with collimated beam", Teichert, J., and Tiunov, M. A., Meas. Sci. Technol. 4 (1993) pp. 754-763, described in more detail below, describes a two stage mass filter with reduced chromatic aberration used with a collimated beam.

Another problem with the column shown in FIG. 1 is that unfocused neutral particles can reach substrate surface 112. Ion sources incidentally also emit neutral particles, while other neutral particles may result from gas-ion collisions occurring between the source tip 114 and the mass filter 102. In the column of FIG. 1, some of these neutral particles will pass through aperture 122 and reach the substrate. Because neutral particles do not respond to the fields of the focusing lenses, neutral particles that are not blocked by the aperture plate are spread out over areas of substrate surface 112 typically much larger than the area scanned by the focused ion beam.

SUMMARY OF THE INVENTION

An object of the invention to provide an improved mass filter for a charged particle beam system.

A mass filter for an ion beam system includes at least two stages and reduces chromatic aberration. One embodiment includes two symmetrical stages that reduce or eliminate chromatic aberration and both entrance and exit fringing field aberrations. Embodiments can also prevent neutral particles from reaching the sample surface and eliminate crossovers in the beam path. In one embodiment, the filter can pass a single species of ion from a source that produces multiple species. In other embodiments, the filter can reduce sputtering of the mass separation aperture.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Embodiments of the invention can provide one or more advantages over typical prior art ion beam systems. Not all embodiments will provide all the benefits. Some embodiments of the invention provide an E×B mass filter that corrects chromatic aberration. Some embodiments of the present invention prevent neutral particles from beam reaching the substrate. Some embodiments of the invention eliminate the need for a beam crossover in the ion column. Some embodiments of the invention correct beam aberrations induced by the entrance and exit electric and magnetic fields. Some embodiments reduce sputtering of the mass separation aperture.

Some embodiments of the invention correct chromatic aberration by first deflecting the beam off axis in one direction, and then deflecting the beam back in the opposite direction so that the beam exits the filter parallel to, and typically offset from, its original path, thereby essentially canceling out the chromatic aberration (working in conjunction with the focusing optics below the mass filter) as explained below. This beam deflection eliminates any direct path through the mass filter, so neutral particles are prevented from reaching the substrate. Some embodiments of the invention include two E×B filters, each comprising a stage of the mass filter. The term "mass filter" or "E×B filter" as used herein can refer to a single stage of a multi-stage filter, or to the multi-stage filter, depending on the context. Also, the term "mass filter" also covers filters that filter by velocity or energy.

It is desirable in many focused ion beam (FIB) applications to achieve a maximized current density at the substrate surface. As described above, beam current density may be reduced by the increased space-charge scattering at a crossover in the beam path. FIGS. 3-7 show FIB column designs that do not include crossovers and can therefore increase beam current density.

In one embodiment, an ion beam column including a mass filter comprises an ion source for providing ions of different masses; a first lens for first forming the ions from the ion source into a beam along a first axis; a first mass filter stage that provides a first beam deflection away from the first axis; a second mass filter stage that provides a second beam deflection opposite to that of the first beam deflection; a mass separation aperture for passing less than all the ions from the second mass filter stage; a second lens receiving ions from the second mass filter and focusing those ions onto a substrate surface, the second mass filter stage substantially canceling the chromatic aberration from the first mass filter stage.

Figure 2:
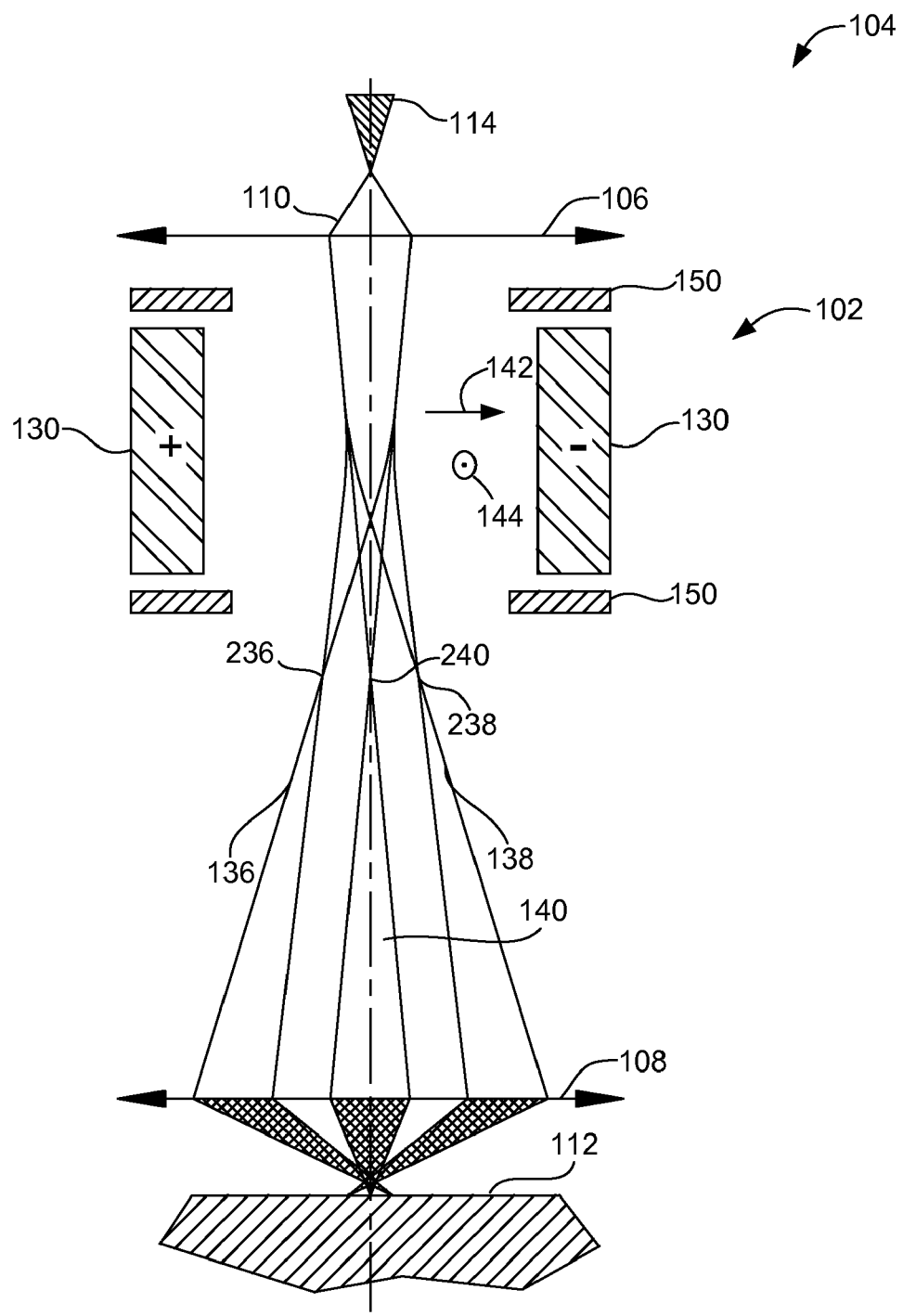
FIG. 2 is a cross-sectional view of the prior art FIB column from FIG. 1 with the mass separation aperture removed so that all ion species are transmitted to the substrate.
Figure 3:
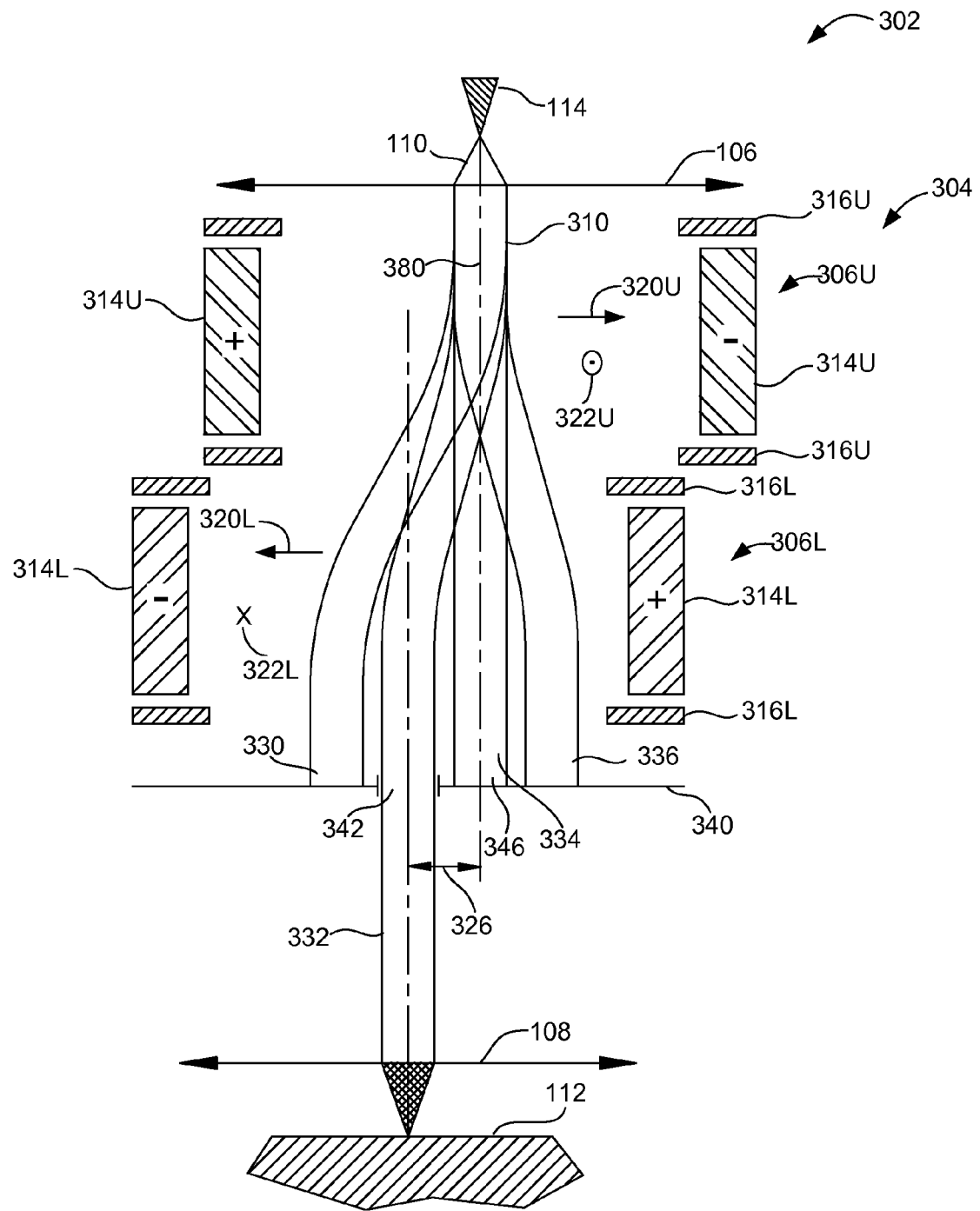
FIG. 3 is a schematic side cross-sectional view of an embodiment of the invention having a two-lens FIB column with a double-deflection aberration-corrected E×B Wien mass filter.

FIG. 3 illustrates an ion column 302 having an aberration-corrected mass filter 304 having two stages, an upper E×B filter 306U and a lower E×B filter 306L. As in FIGS. 1 and 2, ions 110 are emitted from ion source tip 114. This source structure is typical of that in a liquid metal ion source (LMIS), however other types of ion sources may be used in the present invention. Ions 110 are then focused into a substantially parallel beam 310 by upper lens 106. In a completely parallel beam 310, the individual ion trajectories within the beam 310 may be extrapolated back to a virtual source (not shown) at minus infinity along the optical axis 380. A "substantially parallel" beam is a beam for which the virtual source is not necessarily at minus infinity, but for which the extrapolated ion trajectories still intersect the optical axis 380 at a location at least three times farther from the source tip (above or below) than the overall length of the ion column 302. Upper E×B filter 306U includes electrodes 314U, field termination plates 316U, and a magnetic field source (not shown). Electrodes 314U produce an electric field in the plane of the figure, indicated by arrow 320U (pointing from the positive electrode 314U at the left towards the negative electrode 314U at the right—making the electric force on a positive ion towards the right). The magnetic field source produces a magnetic field coming out of the figure, indicated by circle 322U (making the magnetic force on a positive ion towards the left). Lower E×B filter 306L includes electrodes 314L, field termination plates 316L, and a magnetic field source (not shown). Electrodes 314L produce an electric field, indicated by arrow 320L in the plane of the figure, opposite in direction and equal in magnitude to electric field 320U in upper E×B filter 306U. The magnetic field source in lower E×B filter 306L produces a magnetic field going into the figure, as indicated by cross 322L, opposite in direction and equal in magnitude to magnetic field 322U in upper E×B filter 306U. Lower E×B filter 306L is symmetrical with upper E×B filter 306U, typically having an identical structure (rotated 180° and with a symmetry axis offset a distance 326, corresponding to the sum of offsets 402 and 404 in FIG. 4) and producing opposite-direction and equal-magnitude electric and magnetic fields.

Ions 110 include four different ion species as shown: low mass ions 330, lower middle mass ions 332, upper middle mass ions 334, and upper mass ions 336. The low mass ions 330, upper middle mass ions 334, and upper mass ions 336 strike a mass separation aperture plate 340 and do not pass through aperture 342 down to the lower lens 108. The lower middle mass ions 332 pass through both the upper E×B filter 306U and lower E×B filter 306L as shown. Ions 332 then pass through the mass separation aperture 342 and are focused onto substrate surface 112 by the lower lens 108. In the prior art, E×B filters are typically tuned to pass the desired ions (lower middle mass in this example) without deflection. In the embodiment of FIG. 3, the desired ions are deflected to pass through aperture 342 and some of the undesirable ions (in this example, upper middle mass 334), along with the neutral particles, are undeflected and strike aperture plate 340. Other undesirable ions are deflected too much (low mass 330) or too little (high mass 336) to pass through aperture 342.

Neutral particles 346 are undeflected by the electric and magnetic fields in the E×B mass filter 304 and thus pass straight through, striking the mass separation aperture plate 340 because the hole 342 in the aperture plate 340 (which defines the exit axis of the E×B filter 304) is offset a distance 326 from the entrance axis 380 of the E×B filter 304. Although the schematic of FIG. 3 does not make it clear that there is no path to substrate 112 for neutral particles that are undeflected by lens 106, the geometry of an actual system eliminates such a path by various means familiar to those in the art, such as an aperture at the entrance to upper E×B filter 306U and/or an aperture somewhere in the column below mass filter 304. Commonly, the field termination plates 316U and 316L may be configured with openings for the ion beam to enter and exit through which are small enough to serve as apertures. Because the ions that impact aperture plate 340 are not focused onto a point, the wear on the aperture plate caused by ion sputtering is spread over a wider area. Thus aperture plate 340 is less likely to have an unwanted hole sputtered through the plate by the blocked ions, so aperture plate 340 will last longer.

Figure 4:
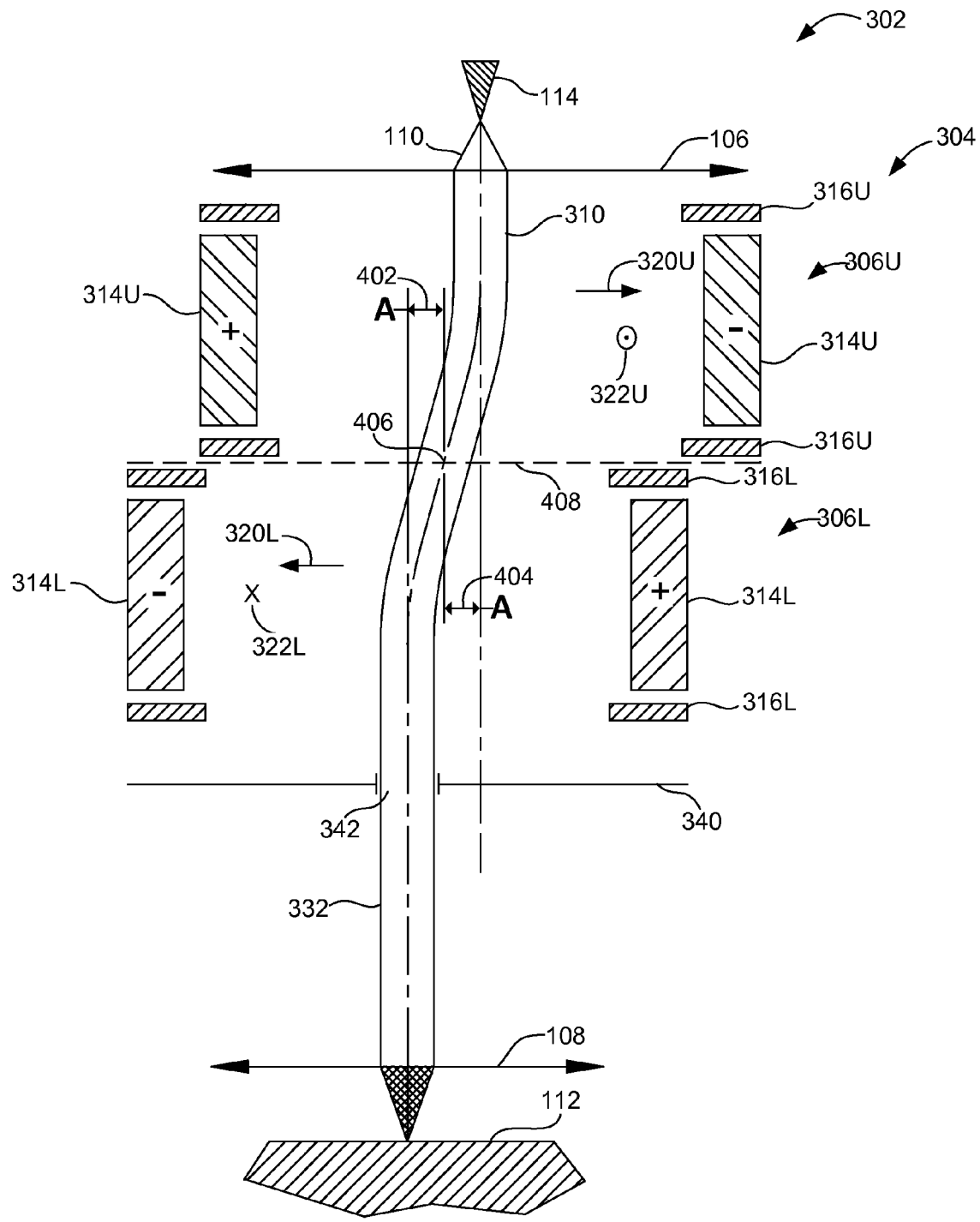
FIG. 4 is a schematic side cross-sectional view of the two-lens FIB column from FIG. 3, showing lateral displacements of the transmitted ion beam.

FIG. 4 shows just the path of the lower middle mass ions 332, which are displaced to the left an amount A 402 while passing through upper E×B 306U, and displaced by the same amount A 404 while passing through lower E×B 306L. The combination of displacements 402 and 404 is 2 A, enabling beam 332 to pass through aperture 342 (which is also offset a distance 2 A) and thus enter the lower lens 108 to be focused onto the surface of substrate 112. The upper E×B mass filter 306U and lower E×B mass filter 306L are identical, positioned relative to each other with a 180° rotation around the 2-fold rotational symmetry axis 406, as shown. The symmetry axis 406 is perpendicular to both the axis of the upper E×B 306U and to the mass separation direction (parallel to the E-field 320U) and is offset from the axis of the upper E×B 306U by a distance A 404 along the mass separation direction. Thus the lower middle mass ions 332 enter the upper E×B 306U on the centerline of the upper E×B 306U, and exit the lower E×B 306L on the centerline of the lower E×B 306L.

The dual mass filter configuration of the present invention differs from the prior art in combining together several key design elements, some of which are not found in the prior art, as illustrated in FIG. 4:

1) The mass separation aperture 342 in aperture plate 340 is offset to the side a distance 2 A from the entrance axis of mass filter 304.

2) The mass filter 304 has a rotational symmetry axis 406 which is offset a distance A from both the entrance and exit axes of the mass filter 304.

3) The lower E×B filter 306L is rotated 180° around the symmetry axis 406 relative to the upper E×B mass filter, thus through symmetry, any aberrations induced while the ion beam passes through the upper E×B 306U tend to be cancelled when the ion beam passes through the lower E×B 306L in essentially the opposite direction (due to the 180° relative orientations of the two E×B filters 306U and 306L). Relative to the symmetry axis of upper E×B 306U, the ion beam enters on-axis and exits off-axis a distance A 404. Relative to the symmetry axis of lower E×B 306L, the beam enters off-axis the same distance A 402 but exits on-axis.

4) The axis of lower E×B filter 306L is offset with respect to the axis of upper E×B filter 306U so that the ion beam enters along the symmetry axis of upper E×B 306U and exits along the symmetry axis of lower E×B 306L.

5) There is no cross-over either within or below the mass filter, thereby reducing space-charge effects and aperture sputtering.

In the prior art, in mass filters comprising multiple E×B elements, the symmetry axes of the individual E×B elements are not offset as shown in FIG. 4, and individual E×B elements are not positioned in a 180° relative orientation to cancel aberrations through the use of rotational symmetry. Prior art mass filters comprising multiple E×B elements are characterized by multiple E×B elements (and the mass separation aperture) all being mounted on the same axis with no relative rotational positioning between them. An example of a prior art mass filter comprising multiple E×B elements is provided in "Achromatic two-stage E×B mass filter for a focused ion beam column with collimated beam", Teichert, J., and Tiunov, M. A., Meas. Sci. Technol. 4 (1993) pp. 754-763, where the two E×B elements are characterized by:

1) No relative offset of their entrance and exit symmetry axes.

2) No 180° relative orientation of the E×B elements.

3) A variable beam aperture between the two E×B elements along the symmetry axis—this aperture will tend to block some trajectories.

4) A stigmator between the two E×B elements to correct the focusing effects of both E×B elements.

5) No offset of the mass separation aperture, with the two E×B elements and the mass separation aperture all being coaxial.

The Teichert article contains detailed aberration formulae and calculations of aberrations of the combined E×B mass filter, but no mention of the use of fundamental symmetries (rotational and offsets of the E×B axes) to reduce these aberrations. Instead, design characteristics such as "the optimal values for the pole piece gap, the pole piece width, the electrode width and the gap between the electrodes." (paragraph 2 in section 3.) are considered. A stigmator located between the two E×B elements compensates for the focusing effects of both E×B elements.

In one embodiment, a silicon-gold alloy liquid metal ion source (LMIS) 114 may produce $Si^+$, $Si^{++}$, $Si_2^+$, $Au^+$, $Au+$, $Au_2^+$, $Au_3^{++}$, $AuSi^+$, $AuSi^{++}$, $Au_2Si^{++}$, and $Au_3Si^{++}$ ions having charge-to-mass ratios of 1/28, 2/28, 1/(2*28), 1/197, 2/197, 1/(2*197), 21(3*197), 1/(197+28), 2/(197+28), 2/(2*197+28), and 2/(3*197+28) (in units of the fundamental charge/amu), respectively. Upper E×B filter 306U includes electrodes 314U separated by approximately 10 mm and having a potential difference of approximately 6000 V between them to produce an electric field strength of approximately 600 V/mm. The magnetic field strength 322U is approximately 4500 Gauss. The lengths of the electrodes 314U and 314L may be 32 mm parallel to the beam axis. The configuration of lower E×B filter 306L is identical to that of upper E×B filter 306U, but with electric and magnetic fields of equal magnitudes and opposite polarities.

Figure 1:
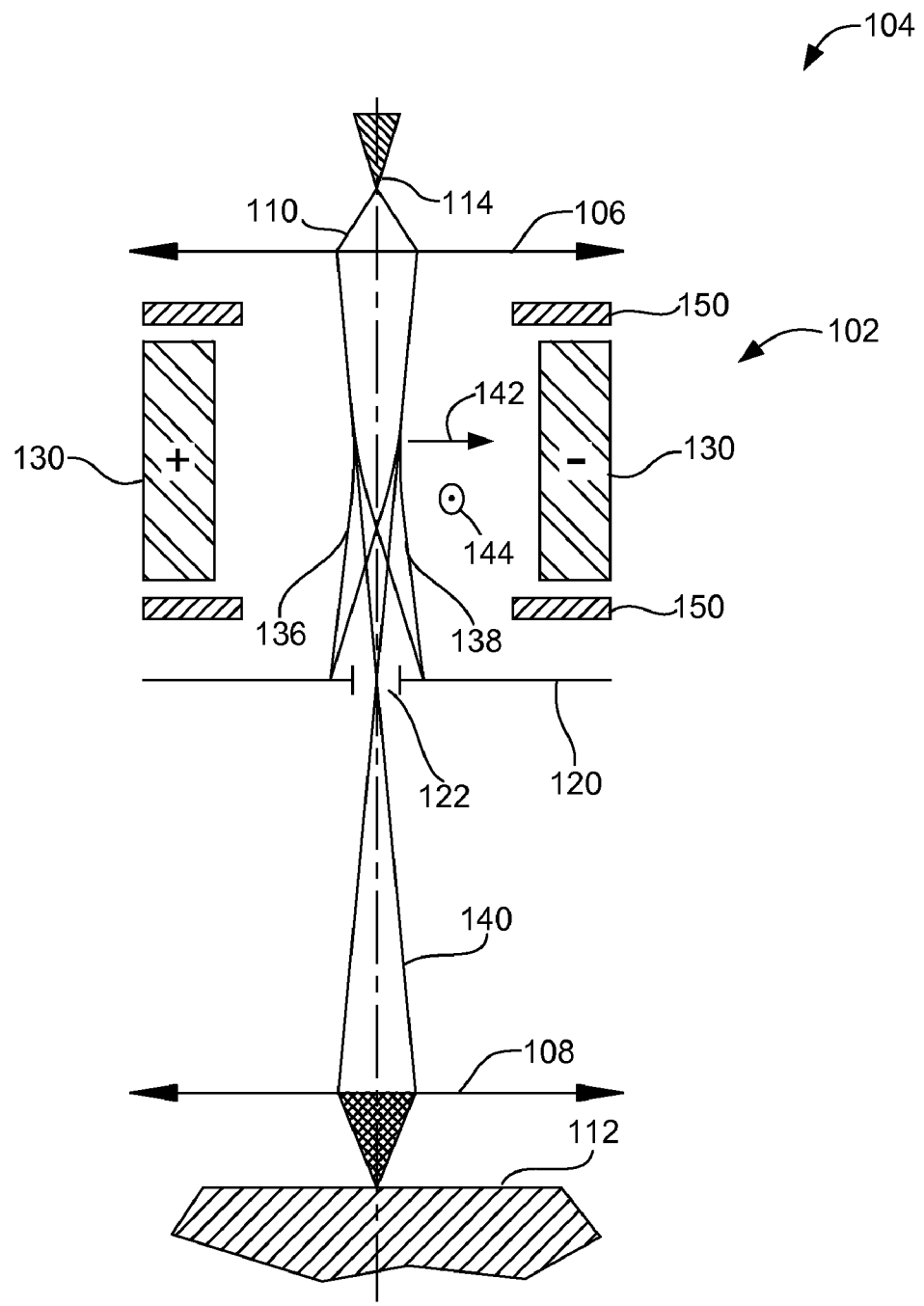
FIG. 1 is a side schematic cross-sectional view of a prior art Wien E×B mass filter in a two-lens focused ion beam (FIB) column
Figure 5:
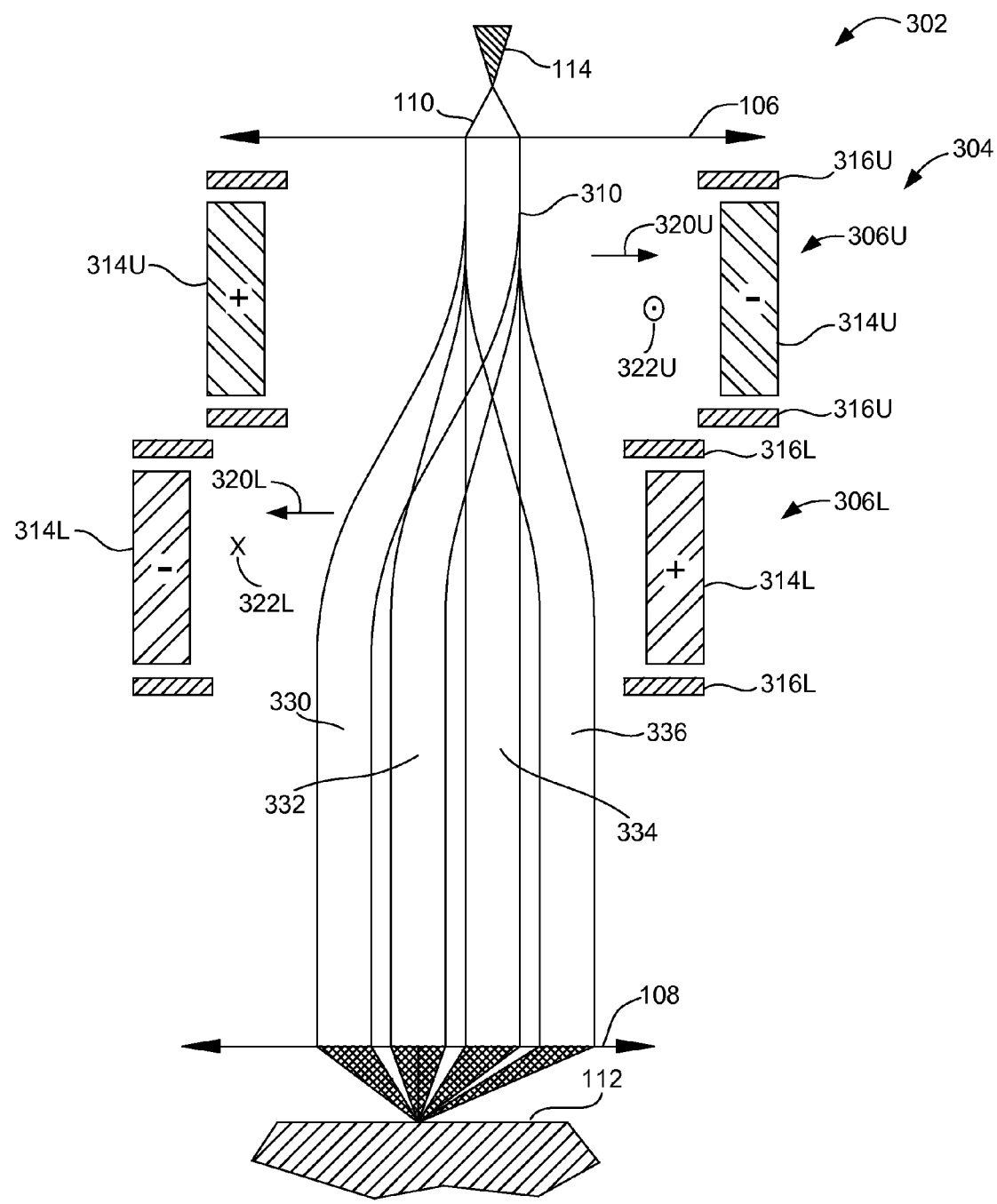
FIG. 5 is a schematic side cross-sectional view of the two-lens FIB column from FIG. 3 with the mass separation aperture removed so that all ion species are transmitted to the substrate.

FIG. 5 shows a FIB column similar to the one shown in FIG. 3, but with the mass separation aperture plate removed to enable all ions (low mass, lower middle mass, upper middle mass, and upper mass) to pass into the lower lens and be focused onto the substrate—this illustration enables the correction of chromatic aberration to be better understood (this can be compared with FIG. 2 relative to FIG. 1). Because all ions emerging from the lower E×B 314L appear to diverge from the same virtual source (at minus infinity), all ions will be focused to the same location on the substrate as the lower middle mass ions in FIG. 3 (ignoring the effects of aberrations in the lower lens). This also means that all lower middle mass ions, independent of their energy, will also be focused into the same location on the substrate, thereby eliminating chromatic aberrations induced by the E×B Wien mass filter. That is, not only are ions of different masses focused to the same spot on the substrate 112 (in the absence of a mass separation aperture), but ions of the same mass and different energies are also focused to the same spot on the substrate 112 (neglecting the effects of aberrations in lens 108). Thus, comparison of the beam locations at the substrate in FIG. 5 with those in FIG. 2 also shows the chromatic aberration correction action of the double-deflection E×B filter. For the case of "substantially parallel" beams 330, 332, 334, and 336, the virtual source will be a distance from tip 114 (above or below) equal to several times the length of column 302, but the same situation holds—all the beams will have the same virtual source location and will thus focus at the same spot on the substrate 112.

Thus, the double-deflection E×B Wien filter of the present invention corrects for chromatic aberrations in the ion beam by maintaining the virtual sources for all beams (with various masses and/or energies) to be at the same location as the virtual source for the beam with the nominal mass and energy (in this example, the lower middle mass ions 342).

While termination plates have been used in the prior art to reduce the electric and magnetic fields outside of the E×B filter, there remain incidental field variations at the entrance and exit of the E×B filters that produce adverse affects on the beam. Systems, such as those shown in FIGS. 3-5 which use multiple E×B filters, can reduce the effect of these undesirable fields on the beam. The significance of this level of symmetry of the E×B filter and the lower middle mass trajectory is illustrated in FIGS. 6-7.

Figure 6:
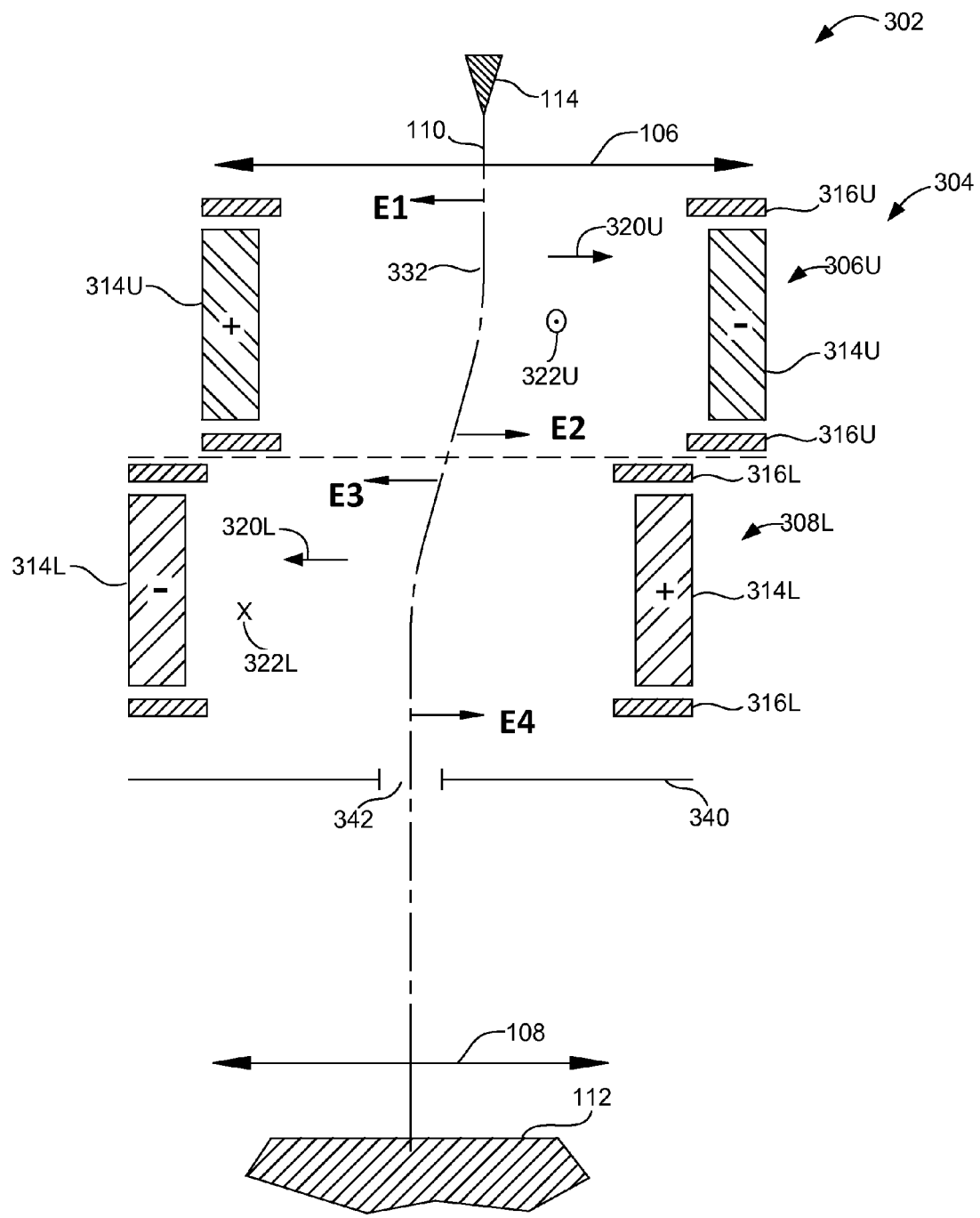
FIG. 6 is a schematic side cross-sectional view of a two-lens column with a double-deflection E×B mass filter, showing the trajectory of the transmitted ion beam, with electrostatic deflection errors E1-E4.
Figure 7:
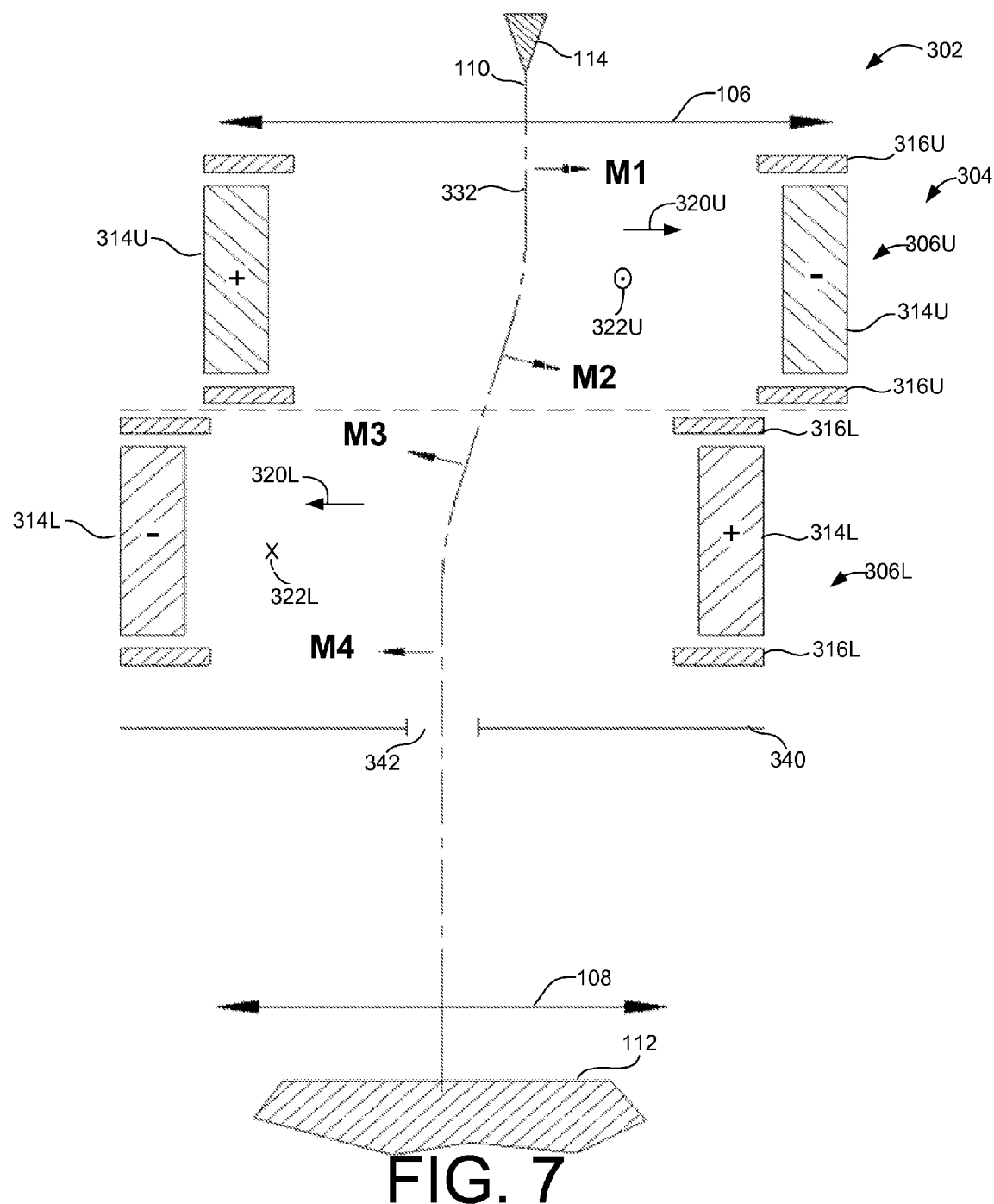
FIG. 7 is a schematic side cross-sectional view of a two-lens column with the double-deflection E×B mass filter, showing the trajectory of the transmitted ion beam, with magnetic deflection errors M1-M4.

FIGS. 6 and 7 illustrate the source and correction of possible electrostatic and magnetic deflection errors in the system of FIGS. 3 and 4. FIG. 6 shows the trajectory (curved centerline) of the lower middle mass ions 332 passing from the ion source 114 at the top, down through the mass filter 304, and then being focused onto the substrate surface 112 by the lower lens 108. In all E×B mass filters, there are entrance and exit regions in which both the electric and magnetic fields change from zero to the field strengths inside the E×B regions. In these regions, it is generally advantageous for the fields to be terminated as abruptly as possible going from the central region (with the electric and magnetic fields) to the outside of the E×B filter (where the electric and magnetic fields are approximately zero)—this is accomplished using field termination plates such as plates 150 in FIGS. 1 and 2, and plates 316U and 316L in FIGS. 3-7.

Even with the termination plates, however, there are still aberrations induced in this region from several causes: 1) the electric and magnetic fields are not terminated with exactly the same ratio, thus incorrect net forces are induced on the ions, and 2) the fields are curved (i.e., E-fields not parallel, or B-fields not perpendicular, to the planes of FIGS. 1-7), resulting in out-of-plane beam deflections.

In FIG. 6, four exemplary beam deflection errors E1-E4 due to the electric fields in the upper E×B 306U and lower E×B 306L are illustrated. Aberrations E1-E4 can arise from the various origins described above. In the upper E×B 306U, error E1 at the entrance is to the left, while error E2 at the exit is to the right. In the lower E×B, error E3 at the entrance is to the left, while error E4 at the exit is to the right. Now, consider the fundamental rotational symmetry between the upper E×B mass filter 306U and the lower E×B mass filter 306L around the 2-fold rotational axis of symmetry 406 shown in FIG. 4. Assuming the upper and lower E×B mass filters are made very precisely and have identical designs, one can disregard any aberrations induced by machining errors, or electrical voltage errors, and assume all errors are fundamental to the electric and magnetic field distributions at the entrances and exits of the upper and lower E×B mass filters. By symmetry, we would expect the following relations to hold:

$$E4 = -E1$$

$$E3 = -E2$$

Then the total beam aberration due to electric field errors passing through the double-deflection E×B mass filter of the present invention would be:

$$E1 + E2 + E3 + E4 = E1 + E2 + (-E2) + (-E1) = 0$$

So, to first-order (ignoring combination errors), the aberrations induced by electric field errors at the entrances and exits of the upper and lower E×B filters are cancelled due to the overall symmetry of the mass filter 304 comprising the upper E×B 306U and lower E×B 306L with a precise 2 A offset between them which exactly corresponds to the beam deflection between ions entering the upper E×B 306U and ions exiting from the lower E×B 306L.

FIG. 7 is a similar illustration for exemplary beam deflection errors M1-M4 due to the magnetic fields in the upper E×B 306U and lower E×B 306L. In the upper E×B, error M1 at the entrance is to the right, while error M2 at the exit is downwards to the right. In the lower E×B, error M3 at the entrance is upwards to the left, while error M4 at the exit is to the left. Again the fundamental 2-fold rotational symmetry of the assembly of the upper and lower E×B filters causes the following relations to hold:

$$M4 = -M1$$

$$M3 = -M2$$

So that the total beam aberration due to magnetic field errors passing through the double-deflection E×B mass filter of the present invention would be:

$$M1 + M2 + M3 + M4 = M1 + M2 + (-M2) + (-M1) = 0$$

So, to first-order (ignoring combination errors), the aberrations induced by magnetic field errors M1-M4 at the entrances and exits of the upper and lower E×B filters are also cancelled, just as was the case for the electric field-induced errors E1-E4 in FIG. 6.

Thus the double-deflection E×B mass filter embodiment of the invention may provide the following key advantages over the prior art:

1) Operation with a parallel or substantially parallel beam with no requirement for a beam cross-over.

2) Removal of neutral particles from the beam exiting the mass filter.

3) Cancellation of chromatic aberrations through the preservation of the virtual source position for all ions passing through the mass filter.

4) Reduction of entrance and exit aberrations induced by electric and magnetic field termination errors.

5) Reduction in sputtering of the mass separation aperture due to spreading out of the ion beam current density.

Reduction in space-charge beam energy and spatial broadening due to the lack of a crossover.

Figure 8:
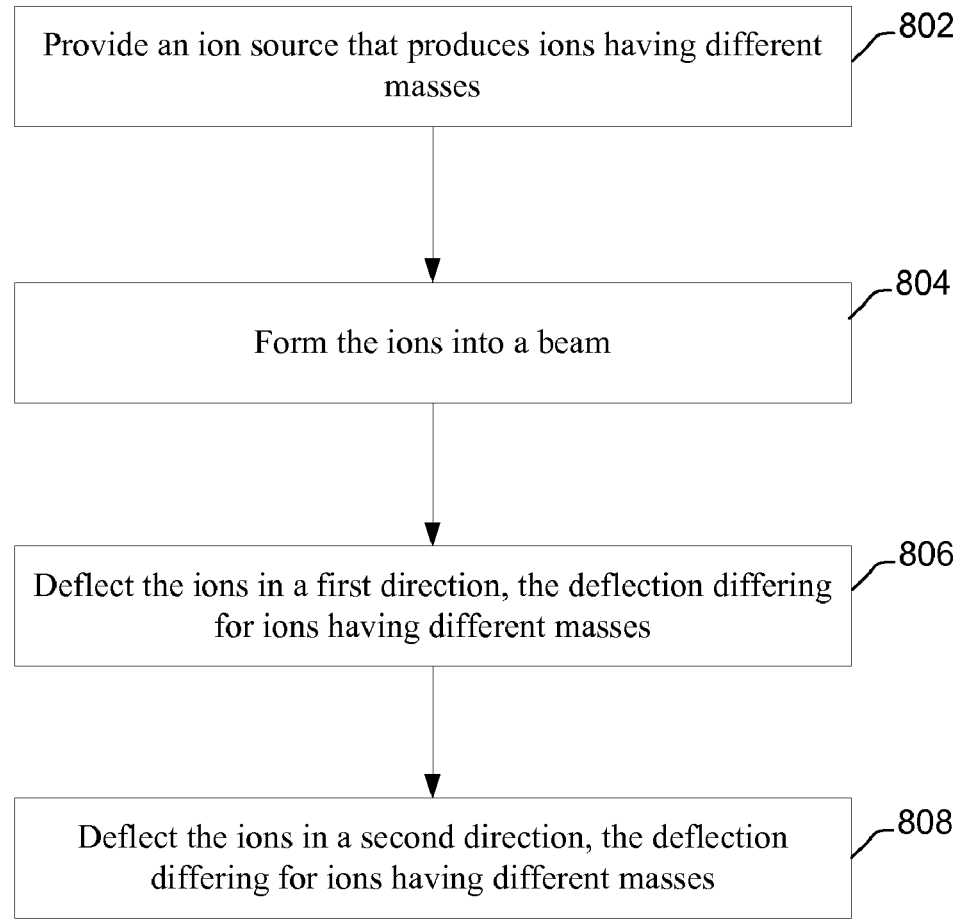
FIG. 8 shows a preferred embodiment of a method of the present invention.

FIG. 8 shows a preferred embodiment of a method of the present invention. In step 802, an ion source is provided that produces ions having different masses. In step 804, the ions from the ion source are formed into a beam. In step 806, the ions are deflected in a first direction, the deflection differing for ions having different masses. In step 808, the ions are deflected in a second direction, the deflection differing for ions of different masses, the different deflection in the first direction for ions of different masses and the deflection difference in the second direction for ions of different masses canceling so that ions of different masses are traveling in the same direction after being deflected twice.

While two embodiments are described, skilled persons will readily recognize that the mass filter may include different designs and concepts for the field-termination plates, different methods of generating the magnetic field (permanent magnets and/or electromagnets), and different pole piece configurations (see "Wide Aperture Wien E×B Mass Filter" filed concurrently herewith and assigned to the assignee of the present invention).

While the embodiments described use an ion source with an emitter tip, ion sources not having emitter tips, such as plasma ion sources, may also be employed with the embodiments of the invention.

The embodiments of FIGS. 3 and 4 show a beam an ion column that does not have a beam crossover, a column in which the beam has one or more crossovers could also be used in embodiments of the present invention. Moreover, a beam having no crossovers could also be used with a single E×B filter in accordance with some embodiments of the invention. While the embodiments described use two E×B filters, additional filters could be used. For example, four filters could be used to provide a beam that leaves the fourth filter along the same axis as the beam entering the first filter. Three filters could also be used, with the cumulative effect of the three filters to provide a beam parallel to the beam that entered the first filter, the final beam being offset or not offset from the original beam.

While E×B filters are described, other types of filters, such as spherical or cylindrical capacitors, can also be used.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding

We claim as follows:

1. An ion beam column including a mass filter, comprising:
an ion source for providing ions of different charge-to-mass ratios;
a first lens for first forming the ions from the ion source into a beam along a first axis;
a first mass filter stage that provides a first beam deflection away from the first axis, the first beam deflection depending on the charge-to-mass ratio of each ion in the beam, the first axis being a symmetry axis of the first mass filter stage;
a rotational symmetry axis, the rotational symmetry axis being oriented perpendicular to both the first axis and the first beam deflection, the rotational symmetry axis being offset parallel to the first beam deflection;
a second mass filter stage positioned 180 degrees around the rotational symmetry axis, a symmetry axis of the second mass filter stage being a second axis, the second mass filter stage providing a second beam deflection opposite to that of the first beam deflection, the combination of the deflections of the first and second mass filter stages being equal to the displacement between the first and second axes for one of the ions of different charge-to-mass ratios exiting the second mass filter stage;
a mass separation aperture for passing less than all the ions from the second mass filter stage, the mass separation aperture being centered on the second axis; and
a second lens receiving ions from the second mass filter and focusing those ions onto a substrate surface,
the second mass filter stage substantially canceling the chromatic aberration from the first mass filter stage at the substrate surface.

2. The ion beam column of claim 1 in which the first mass filter stage and the second mass filter stage are E×B filters.

3. The ion beam column of claim 1 in which the ion source is a liquid metal ion source.

4. The ion beam column of claim 1 in which the ion source is a plasma ion source.

5. The ion beam column of claim 1 in which the ions enter the first mass filter stage in a substantially parallel beam.

6. The ion beam column of claim 1 in which the second lens stage focuses ions of different energies from virtual sources that are located at infinity.

7. The ion beam column of claim 1 in which the second mass filter stage substantially cancels fringing field aberrations from the first mass filter stage.

8. A method of providing a beam of ions from an ion source providing ions of different masses, comprising:
providing ions having different masses from an ion source;
forming the ions into a beam;
deflecting the ions in a first direction, the deflection differing for ions of different masses; and
deflecting the ions in a second direction, the deflection differing for ions of different masses, the different deflection in the first direction for ions of different masses and the deflection difference in the second direction for ions of different masses canceling so that ions of different masses are traveling in the same direction after being deflected twice.

9. The method of claim 8 in which deflecting the ions in a first direction includes passing the ions through a first E×B mass filter and in which deflecting the ions in a second direction includes passes the ions through a second E×B mass filter.

10. The method of claim 9 further comprising passing some of the ions through an aperture while blocking others of the ions, the aperture center offset from the optical axis of the first E×B filter.

* * * * *